United States Patent [19]

Grace et al.

[11] Patent Number: 5,059,915
[45] Date of Patent: Oct. 22, 1991

[54] VECTOR NETWORK ANALYZER RF PULSE PROFILING METHOD AND APPARATUS

[75] Inventors: Martin I. Grace, San Jose; Peter M. Kapetanic, Morgan Hill, both of Calif.

[73] Assignee: Wiltron Company, Morgan Hill, Calif.

[21] Appl. No.: 444,711

[22] Filed: Dec. 1, 1989

[51] Int. Cl.⁵ .................. G01R 23/16; G01R 27/02
[52] U.S. Cl. .................................... 324/650; 324/603; 324/605; 324/638; 324/615; 324/616; 324/619; 324/77 B; 328/151
[58] Field of Search .......... 328/151; 324/78 D, 79 D, 324/616, 615, 650, 638

[56] References Cited

U.S. PATENT DOCUMENTS

| | | | |
|---|---|---|---|
| 3,500,183 | 3/1970 | McCutcheon | 324/121 R |
| 3,621,325 | 11/1971 | Moffitt | 324/121 R |
| 4,176,317 | 11/1979 | Manfreda | 324/79 D |
| 4,758,783 | 7/1988 | Danzeisen | 324/79 D |

Primary Examiner—Kenneth A. Wieder
Assistant Examiner—Jose M. Solis
Attorney, Agent, or Firm—Fliesler, Dubb, Meyer & Lovejoy

[57] ABSTRACT

A vector network analyzer comprising a circuit for measuring the real and imaginary components of the central spectral line in an RF pulse from a device-under-test is provided. The circuit comprises a modulator in response to a profiling pulse for modulating the amplitude of the RF pulse, mixers for down-converting the frequency of the amplitude modulated RF pulse, a narrow band filter for filtering the RF pulse having a bandwidth of 500 Hz and a synchronous detector responsive to the output of the crystal filter for providing a pair of dc outputs, which correspond to the real and imaginary components of the output of the device under test as the profiling pulse is shifted in time relative to the RF pulse.

21 Claims, 6 Drawing Sheets

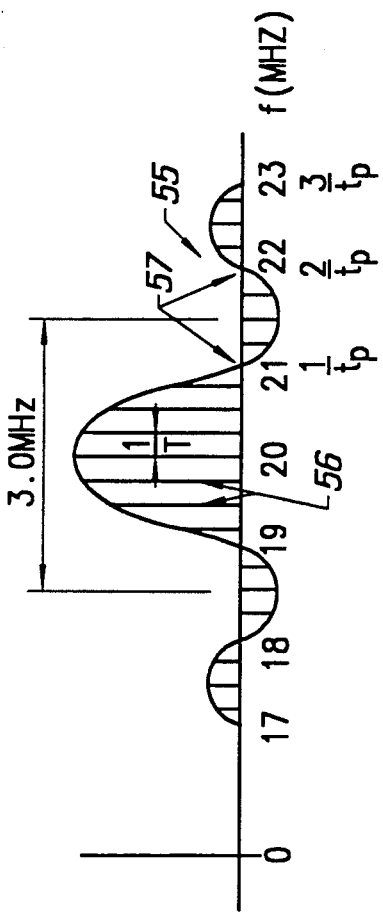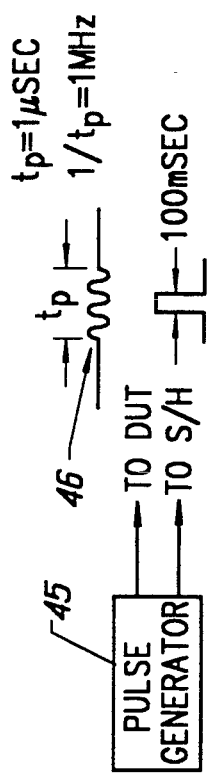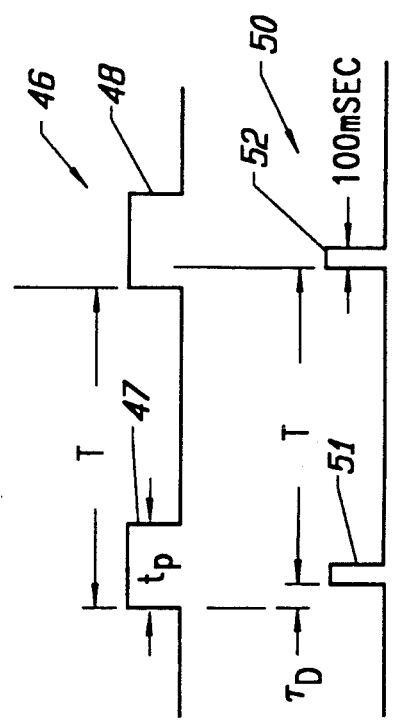
FIG. 9
FIG. 10
FIG. 11
FIG. 12

VECTOR NETWORK ANALYZER RF PULSE PROFILING METHOD AND APPARATUS

BACKGROUND OF THE INVENTION

1. Field of the Invention

The present invention relates to methods and apparatus for measuring the amplitude and phase of an RF test signal in general and in particular to a method and apparatus for use in a vector network analyzer comprising a time varied profile pulse and narrow bandwidth filter for measuring the magnitude and phase of the spectral lines in an RF stimulus pulse.

2. Description of the Prior Art

A vector network analyzer is used the electrical characteristics, i.e. the forward and reverse S-parameters, of a device, i.e. electrical network, having an input port and an output port. The S-parameters are obtained by selectively applying a reference signal RA and RB to the input and output ports and measuring the signals, called test signals, reflected from and transmitted through the device in response thereto. The reflected and transmitted test signals from the input port are called TA and those from the output port are called TB. The following equations define the S-parameters:

Forward Measurements $$S_{21} = \frac{TB}{RA} \text{ transmitted} \quad (1)$$

$$S_{11} = \frac{TA}{RA} \text{ reflected} \quad (2)$$

Reverse Measurements $$S_{12} = \frac{TA}{RB} \text{ transmitted} \quad (3)$$

$$S_{22} = \frac{TB}{RB} \text{ reflected} \quad (4)$$

The reference signal may be a continuous wave (CW) signal or a phase-coherent RF pulse, also called a stimulus pulse.

In a prior known network analyzer which uses a CW reference signal, the CW test signal which is reflected from or transmitted through the device-under-test (DUT) is detected using a synchronous detector. The synchronous detector provides a pair of dc output signals, the amplitudes of which correspond to the real $R_e$ and imaginary $I_m$ components of the test signal represented by the equations:

$$R_e = A \cos\phi \quad (5)$$

$$I_m = A \sin\phi \quad (6)$$

where

A = the amplitude of the test signal; and
$\phi$ = the phase of the test signal relative to the reference signal From equations (5) and (6) the average amplitude A and phase $\phi$ can be obtained from the following:

$$A = \sqrt{R_e^2 + I_m^2} \quad (7)$$

$$\phi = \tan^{-1} \frac{I_m}{R_e} \quad (8)$$

Detecting the amplitude and phase of a CW test signal using a synchronous detector simply requires a system having a sufficient bandwidth centered at the frequency of the CW test signal. This is because, as shown by a Fourier analysis, a CW test signal comprises in the frequency domain a single spectral line at the frequency of the CW test signal. Detecting the amplitude and phase of a phase-coherent pulsed-RF test signal, however, is more complex.

A train of phase-coherent RF test pulses comprises in the frequency domain, as shown by a Fourier analysis, a plurality of uniformly spaced spectral lines and nodes. The amplitude of each line corresponds to the contribution of that line to the amplitude and phase of the entire pulse. The spacing between the lines is a function of the cycle time T, i.e. the pulse repetition frequency $1/T$ and the spacing of the first nodes from the center frequency and each adjacent node is a function of the period of the pulse $t_p$, i.e. $1/t_p$.

If the bandwidth of a system is broad enough to detect all of the spectral lines of an RF test pulse simultaneously, the resulting output comprises an instantaneous value of the magnitude and phase of the test pulse, but the signal-to-noise ratio of the detected signal is relatively low as a result thereof. On the other hand, if the bandwidth of the system is reduced so as to encompass less than all the spectral lines, the signal-to-noise ratio is improved, but a less accurate measure of the amplitude and phase of the test signal is obtained.

In a prior known pulsed-RF network analyzer, the test pulses reflected from or transmitted through a DUT are down-converted to a 20 MHz intermediate frequency (IF), passed through a broadband amplifier having a bandwidth of 3.0 MHz and detected in a synchronous detector. The outputs from the detector comprising the real $R_e$ and imaginary $I_m$ components of the detected test signal as described above are then sampled in a sample-and-hold circuit and converted to a digital signal in an analog-to-digital converter.

In a specific embodiment of the above-described pulsed-RF analyzer, the pulse period $t_p$ is 1 microsecond ($\mu$sec) so that in the frequency domain the spectral lines have a uniform spacing of $1/T$ and the spectral nodes in the frequency spectrum are uniformly spaced from the center frequency by $1/t_p$, i.e. 1 MHz. With a system bandwidth of 3.0 MHz, the number of spectral lines detected is restricted to the principal lobe centered at 20 MHz and one half of each of the adjacent side lobes.

In operation, a sampling pulse of 100 nanoseconds (100 nsec) is applied to the sample-and-hold circuits and moved across the profile of the detected pulse to obtain a measure of the amplitude and phase of the detected pulse within each period of the sampling pulse.

While theoretically capable of measuring the amplitude and phase of a single pulse, the above-described prior known pulsed-RF analyzer has several disadvantages.

In order to obtain an accurate measurement of the amplitude and phase of a detected signal, it is necessary to detect all of the spectral lines in the detected pulse. However, as described above, the prior known system detects only those lines within the principal lobe and one-half of each adjacent side lobe, i.e. within the 3.0 MHz spectral bandwidth. Consequently, a number of spectral lines are not detected.

A system having a bandwidth of 3.0 MHz as described above necessarily restricts the minimum RF pulse duration to about 1 $\mu$sec. This is because narrower RF pulses would increase the spacing of the spectral lobes detected and hence reduce the accuracy of the desired amplitude and phase information. This limitation is significant because modern RF signal processing systems, such as radars, routinely use stimulus pulses having a period of much less than 1 μsec.

A further disadvantage of the above-described pulsed-RF analyzer is that currently available sample-and-hold circuits require a sampling pulse having a period of at least 100 nsec. With a period of that length, the sampling of an RF pulse having a period of 1 μsec. is limited to 10 samples. Furthermore, a sampling period as long as 100 nsec. does not allow for an accurate sampling of leading and trailing edges of the test pulse.

Still another disadvantage of the above-described prior known pulsed-RF analyzer is that, having a broad system bandwidth, its dynamic range is restricted, tests have shown, to about 60 db.

SUMMARY OF THE INVENTION

In view of the foregoing, principal objects of the present invention are a method and apparatus for use in a vector network analyzer comprising a novel narrow bandwidth RF pulse profile measuring circuit with means for detecting individual spectral lines in the pulse.

In accordance with the above objects, there is provided in the pulse profile measuring circuit a modulator for modulating the amplitude of RF stimulus pulses reflected from or transmitted through a DUT, a plurality of mixers for down-converting the frequency of the RF stimulus pulses, a narrow bandpass filter, a synchronous detector, a pair of sample-and-hold circuits and a pair of analog-to-digital converters.

The modulating signal applied to the modulator comprises a narrow pulse, called a profiling pulse, having the same repetition rate or cycle time T as the stimulus pulses and a period τ as narrow as 10 nsec. A pulse generator which is used for generating both the stimulus pulse and the profiling pulse includes means for selectively shifting the profiling pulse in time relative to the stimulus pulse.

In operation, as the RF stimulus pulses are received from the DUT they are modulated by the profiling pulse. The frequency of the modulated RF pulses is then down-converted in two mixer stages. Thereafter, the RF pulses are filtered in a narrow bandpass filter having a bandwidth of 500 Hz. The frequency of the filtered pulses is then further down-converted. The filtered pulses after the frequency down-conversion are then detected in the synchronous detector. The synchronous detector provides a pair of dc output signals the amplitudes of which correspond to the real and imaginary components of the detected pulses. The dc output signals are then sampled in the sample-and-hold circuits and converted to digital signals in the analog-to-digital converters for subsequent processing including the calculation of the amplitude and phase thereof using equations (7) and (8) above.

The bandwidth of the narrow bandpass filter, i.e. 500 Hz, is chosen so that the central spectral line in the detected RF stimulus pulse can be detected as the profiling pulse is selectively shifted in time relative to the stimulus pulse. By minimizing its bandwidth to allow only the central spectral line to be detected as the profiling pulse is shifted in time relative to the stimulus pulse, maximum noise rejection and a large dynamic range which varies as a function of the duty factor DF of the system is achieved. The change in dynamic range decreases as a function of:

$$20 \log_{10} DF \quad (9)$$

where $$DF = \tau/T$$

While the dynamic range of the system of the present invention decreases as a function of the duty factor, it is found that the dynamic range for duty factors as low as 0.01 is still higher than is the dynamic range of the above-described prior known pulse profiling system. For example, with a stimulus pulse having a cycle time of 1,000 nsec. and a profiling pulse having a period as short as 10 nsec., the duty factor DF is 0.01. With a duty factor as low as 0.01, the system of the present invention still has a dynamic range of 65 dB for a 20 GHz pulse and 70 dB for a 1 GHz pulse, 5 to 10 dB higher than the prior known system. Indeed, for a CW stimulus test signal, the dynamic range of the present invention is 45 to 50 dB higher than the prior known system.

BRIEF DESCRIPTION OF THE DRAWINGS

The above and other objects, features and advantages of the present invention will become apparent from the following detailed description of the accompanying drawings, in which:

FIG. 9 is a partial diagram of the positive line spectrum for the phase-coherent pulse in the circuit of FIG. 8;

FIG. 10 is a block diagram of a pulse generator which is used for generating pulses for the circuit of FIG. 8;

FIG. 11 is a diagram of the envelope of a stimulus pulse used in the circuit of FIG. 8;

FIG. 12 is a diagram of a sampling pulse used in the circuit of FIG. 8;

DESCRIPTION OF A PREFERRED EMBODIMENT OF THE INVENTION

The RF pulse profiling apparatus according to the present invention as well as prior known pulse measuring apparatus used for measuring the phase and amplitude of test signals in vector network analyzers are capable of using test signals comprising continuous wave (CW) test signals as well as pulsed RF signals. To better understand the operation of these circuits, a brief discussion of the spectrum of continuous wave and pulsed RF signals may be helpful.

Figure 1:
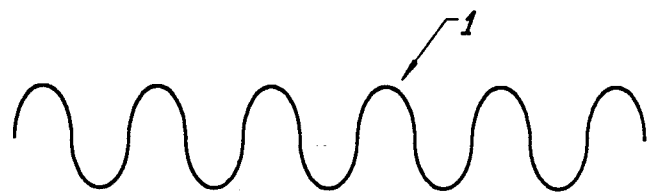
FIG. 1 is a representation of a cosine wave.

Referring to FIG. 1, there is provided a diagram representing a CW test signal which may be defined by the equation:

$$Y = A \cos \omega t \quad (10)$$

where

A = the maximum amplitude of the CW signal
$\omega = 2\pi f$, the frequency of the CW signal
t = time.

Figure 2:
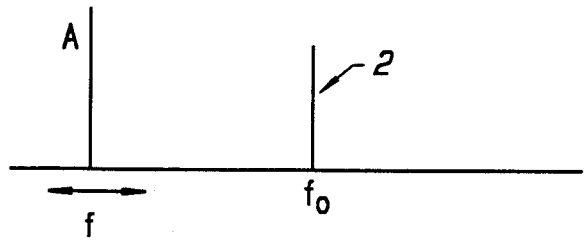
FIG. 2 is a diagram of the positive spectral line obtained from a Fourier analysis of the cosine wave of FIG. 1.

Referring to FIG. 2, there is shown a positive line spectrum of the CW signal of FIG. 1, the corresponding negative line spectrum in FIG. 2 and the other drawings of line spectra herein being omitted. As shown by a Fourier analysis of the CW signal of FIG. 1 using the following equation:

$$F(\omega) = \frac{1}{T} \int_{-T/2}^{+T/2} f(t) e^{-jn\omega t} dt \quad (11)$$

where n = 0, 1, 2, 3 ...

there exists a line spectra centered at $\pm f_0$, the frequency of the CW signal, having an amplitude A corresponding to the constant amplitude of the CW signal.

Figure 3:
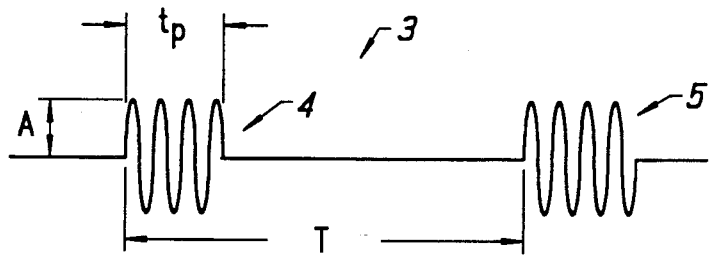
FIG. 3 is a diagram of a phase-coherent pulse train.

Referring to FIG. 3, there is provided a representation of a phase-coherent pulse train having a cycle time T and comprising a plurality of RF pulses 4 and 5, each having a period $t_p$, an amplitude A and a frequency $f_0$.

Figure 4:
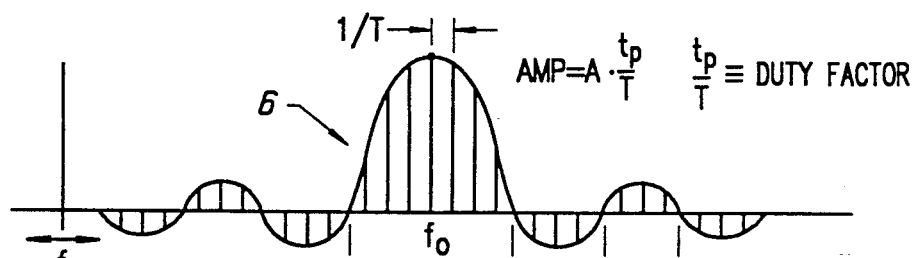
FIG. 4 is a partial diagram of the positive line spectrum for the phase-coherent pulse train of FIG. 3.

Referring to FIG. 4, there is provided a diagram of a partial spectrum 6 of the pulses of FIG. 3. As shown by a Fourier analysis of the pulses of FIG. 3, the spectrum 6 comprises a plurality of lines uniformly spaced about the center frequency $\pm f_0$. The lines are separated one from another by a frequency corresponding to $1/T$. The nodes or zero crossings of the spectrum are uniformly spaced from the center frequency $\pm f_0$ by a frequency corresponding to $1/t_p$. The amplitude of the spectral line at $\pm f_0$ is defined by $A(t_p/T)$. As will be noted, the amplitude of each of the lines decreases with increasing and decreasing frequency from the center frequency $\pm f_0$.

Figure 5:
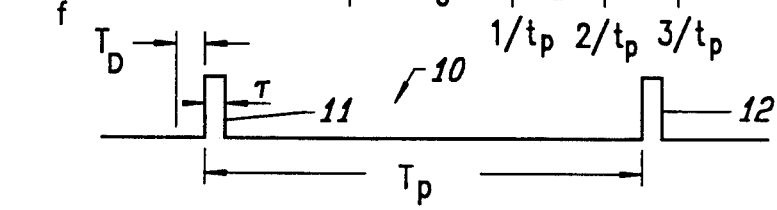
FIG. 5 is a diagram of a profiling pulse according to the present invention.

Referring to FIG. 5, as will be further described below with respect to the present invention, there is provided a profiling pulse train designated generally as 10, comprising a plurality of profiling pulses 11, 12. Each of the profiling pulses 11, 12 have a period $\tau$ and a cycle time $T_p$ which is equal to the cycle time T of the pulse train of FIG. 3. Further, as will be described below, the pulse generator which generates the profile pulses 11, 12 is provided with means for shifting the profiling pulses 11, 12 in time relative to the pulses in the pulse train 3 of FIG. 3 by a variable amount designated as $T_D$.

Figure 6:
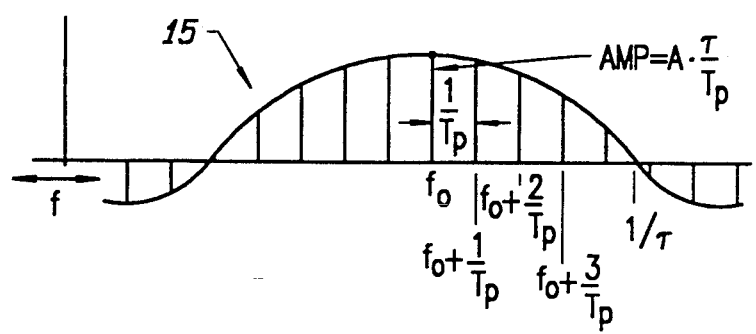
FIG. 6 is a partial diagram of the positive spectrum for the profiling pulse of FIG. 5.

Referring to FIG. 6, there is provided a diagram of the partial spectrum designated generally as 15 as obtained by a Fourier analysis of the profiling pulses of FIG. 5. As described above with respect to the spectrum of FIG. 4, the spectrum 15 of FIG. 6 comprises a plurality of spectral lines which are uniformly spaced from a center frequency $\pm f_0$ by a frequency corresponding to $1/T_p$ and having uniformly spaced nodes or zero crossings at uniformly spaced frequencies corresponding to $1/T$. The amplitude of the spectral line at the frequency $\pm f_0$ equals $A(\tau/T_p)$.

Figure 7:
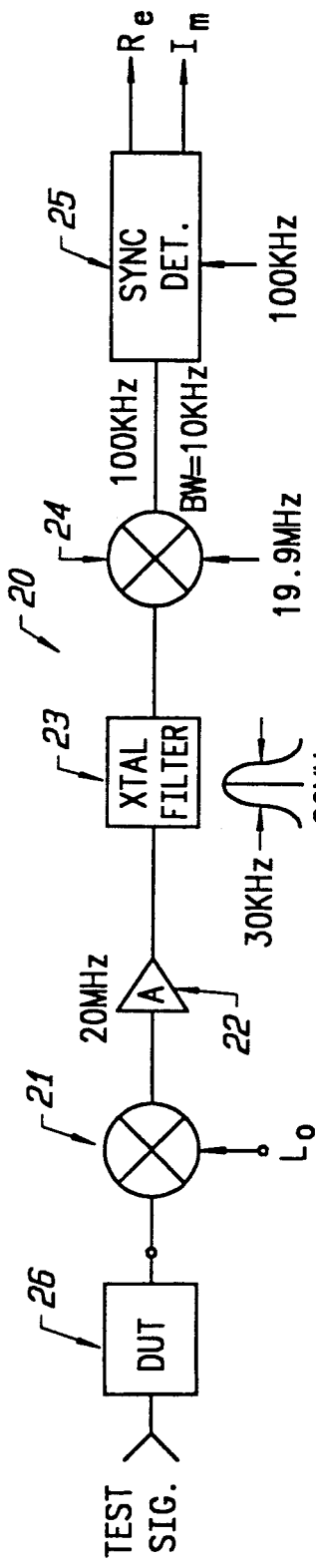
FIG. 7 is a block diagram of a prior art circuit for measuring the amplitude and phase of a continuous wave test signal.

Referring to FIG. 7, there is provided a block diagram of a prior known test signal measuring circuit designated generally as 20. The circuit 20 is provided for measuring the amplitude and phase of a test signal received from a device-under-test (DUT). In the circuit 20 there is provided a mixer 21, an amplifier 22, a crystal filter 23, a mixer 24, and a synchronous detector 25, all of which are coupled in series to a DUT 26.

In operation, a CW test signal is coupled to the input of and transmitted through the DUT 26. Depending upon the electrical characteristics of the DUT 26, the test signal appearing at the output of the DUT 26 may be changed in amplitude and/or phase. In the mixer 21, the test signal having a frequency $f_0$ is down-converted in response to a local oscillator having an output frequency $L_0$ to a frequency of 20 MHz. The 20 MHz signal is then amplified in the amplifier 22 and passed through the crystal filter 23. The filter 23, which has a bandwidth of 30 kHz centered about a frequency of 20 MHz, provides an output to the mixer 24. In the mixer 24 the output of the filter 23 in response to a local oscillator output signal having a frequency of 19.9 MHz is down-converted to 100 kHz with a bandwidth of 10 kHz. The synchronous detector 25 in response to the output of the mixer 24 provides a first dc output $R_e$ and a second dc output $I_m$ which correspond respectively to the real and imaginary components of the spectral line centered at $f_0$ as described above with respect to FIGS. 1 and 2. The outputs $R_e$ and $I_m$ are then processed to obtain the instantaneous amplitude and phase of the signal at the output of the DUT 26 according to the following equations:

$$\phi = \tan^{-1} \frac{I_m}{R_e} \quad (12)$$

$$A = \sqrt{R_e^2 + I_m^2} \quad (13)$$

Figure 8:
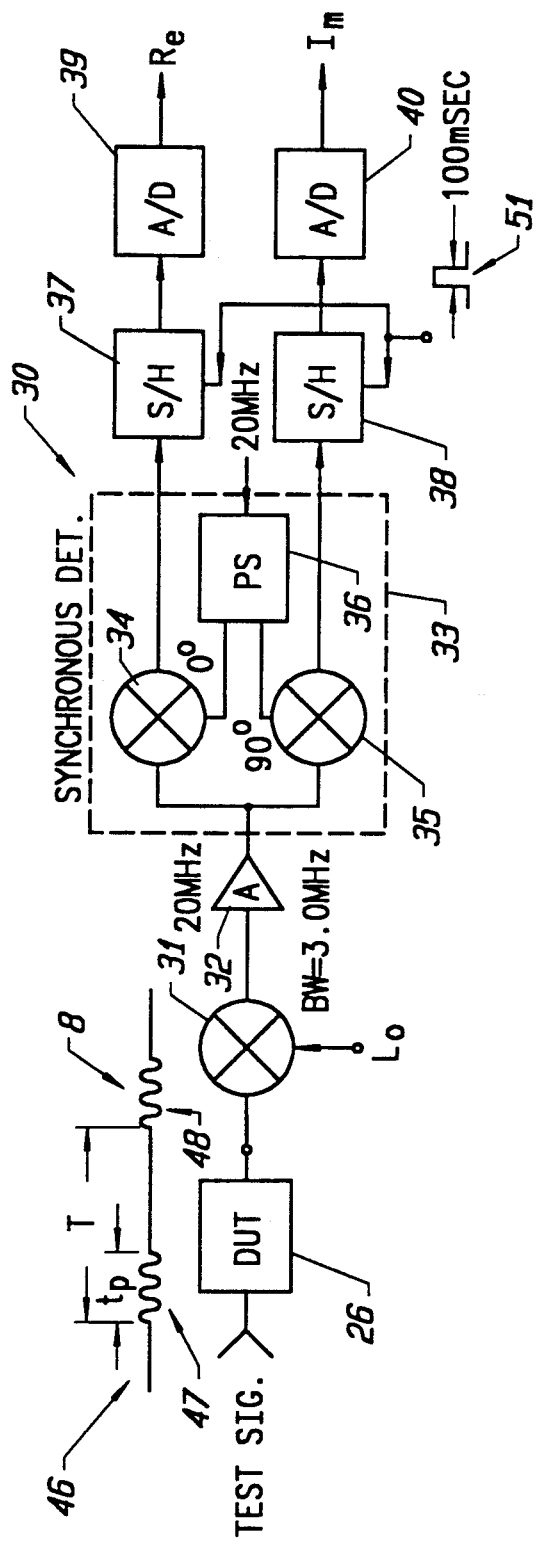
FIG. 8 is a block diagram of a prior art circuit for measuring the amplitude and phase of a phase-coherent test pulse.

Referring to FIG. 8, there is shown a block diagram of a prior known circuit designated generally as 30 for measuring the amplitude and phase of pulsed RF test signals. In the circuit 30 there is provided a mixer 31, an amplifier 32 having a bandwidth of 3.0 MHz, a synchronous detector 33 comprising a pair of mixers 34 and 35 and a splitter 36, a pair of sample-and-hold circuits 37 and 38 coupled to the outputs of the mixers 34 and 35, respectively, and a pair of analog-to-digital converters 39 and 40 coupled to the outputs of the sample-and-hold circuits 37 and 38, respectively.

In FIG. 10, there is shown a block diagram of a pulse generator 45. Pulse generator 45 is provided for generating a phase-coherent pulse train 46, as shown in FIG. 11 and in the upper left-hand corner of FIG. 8. The pulse train 46 comprises a cycle period T and a plurality of pulses 47 and 48 having a period $t_p$. The pulse generator 45 also generates a pulse train 50 comprising a plurality of sampling pulses 51 and 52. The pulse train 50 comprises the same cycle time T as the pulse train 46. Each of the pulses 51 and 52 have a minimum period of about 100 nsec. which is the minimum pulse width that can be used with currently available sample-and-hold circuits.

In a typical embodiment of the circuit of FIG. 8, the period $T_p$ of the pulses 47 and 48 is 1 $\mu$sec. such that the frequency $1/t_p$ equals 1 MHz. As will be further described below, the pulse generator 45 includes means for shifting the pulses 51 and 52 in time relative to the pulses 47 and 48.

In operation, the reference signal pulse train 46 is applied to the input of the DUT 26. The test signal appearing at the output of the DUT 26 which may have been changed in amplitude and phase depending upon the electrical characteristics of DUT 26, is then downconverted in the mixer 31 to a frequency of 20 MHz and limited to a bandwidth of 3.0 MHz centered at 20 MHz in the amplifier 32. The output of the amplifier 32 is then detected in the synchronous detector 30. The resulting dc outputs of the mixers 34 and 35 which correspond respectively to the amplitude of the real and imaginary components of the output of the amplifier 32 are sampled and held in the sample-and-hold circuits 37 and 38, respectively. The outputs of the sample-and-hold circuits 37 and 38 are then converted to digital signals in the analog-to-digital converters 39 and 40, respectively, so as to provide the outputs $R_e$ and $I_m$ corresponding to the amplitude of the real and imaginary components of the output of the amplifier 32. As described above with respect to the circuit of FIG. 7, the signals $R_e$ and $I_m$ can then be used to determine the amplitude and phase of the output of the amplifier 32 according to the above equations (5) and (6).

Referring to FIG. 9, there is provided a spectrum 55 of the pulse train 46 comprising a plurality of uniformly spaced spectral lines 56 and a plurality of nodes or zero crossover points 57. Each of the spectral lines 56 are uniformly spaced from a center frequency of 20 MHz by a frequency corresponding to $1/T$ equal to the pulse repetition frequency of the pulse train 46. The nodes or zero crossing points 57 are uniformly spaced from the center frequency of 20 MHz by the frequency $1/t_p$, i.e. 1 MHz, corresponding to the period $t_p$ of the pulses 47 and 48.

As can be seen in FIG. 9, the signal detected by the synchronous detector 30 is limited to the principal lobe and one half of each of the adjacent lobes of the spectrum 55 due to the 3.0 MHz bandwidth of the amplifier 32.

As the sampling pulses 51, 52 are shifted in time relative to the test signal pulse train 46, the amplitude of the spectral lines within the bandwidth 3.0 MHz is sampled so as to provide a measure of the amplitude and phase thereof within the 3.0 MHz bandwidth. However, because not all of the spectral lines in the spectrum are detected, the output of the synchronous detector 30 cannot provide a precise measure of the phase and amplitude of the test signal at the output of the DUT 26.

The circuits of FIGS. 7 and 8 are described as being used for measuring the amplitude and phase of a test signal at the output of a DUT 26 resulting from a reference signal applied to the input of the DUT 26. It should be understood, however, that the circuits of FIGS. 7 and 8, as well as the apparatus of the present invention, can be used also for measuring all of the S-parameters of a DUT, as will be described below.

Figure 13:
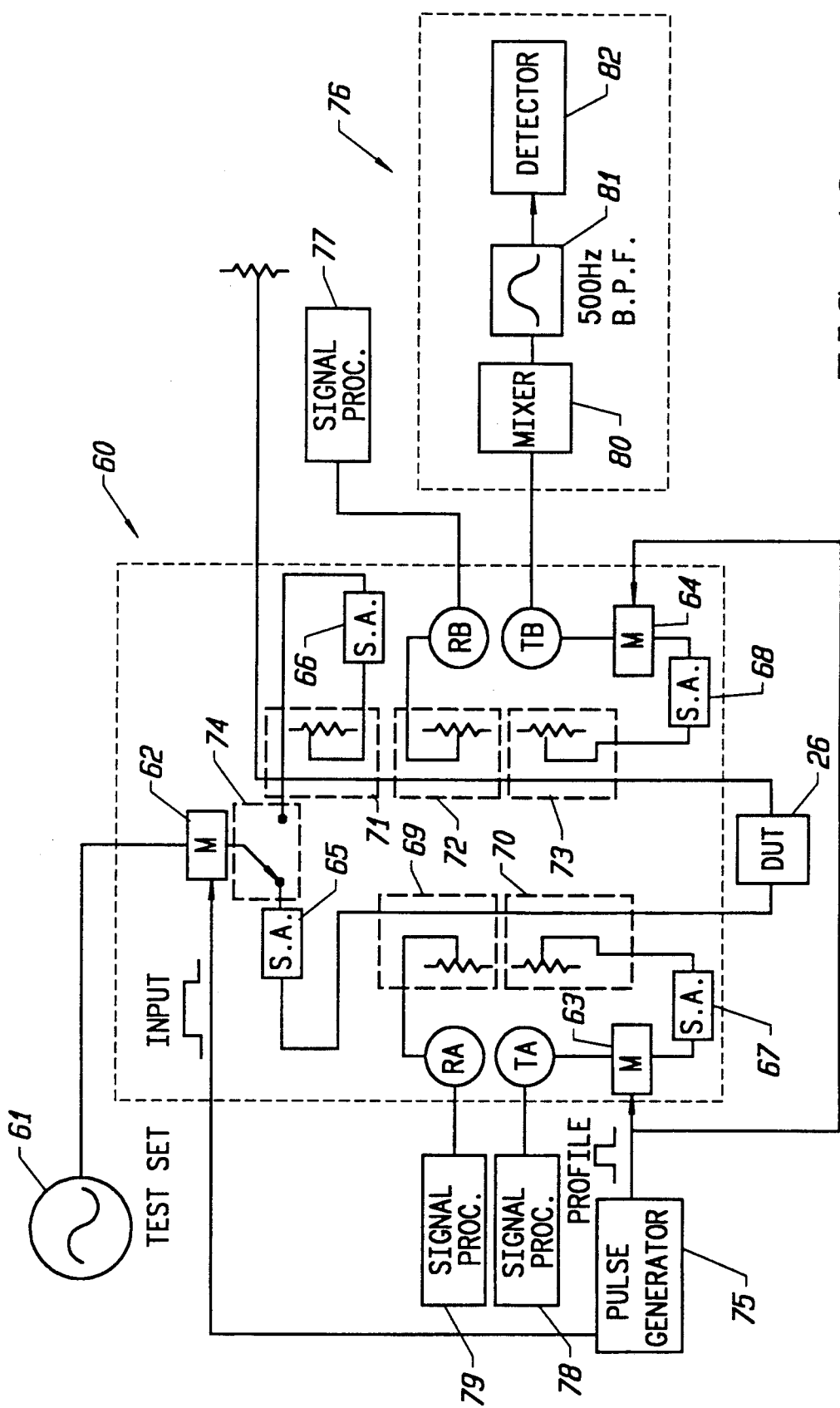
FIG. 13 is a partial block diagram of a network analyzer test set with circuit means for measuring the amplitude and phase of a phase-coherent RF pulse according to the present invention.

Referring to FIG. 13, there is provided in according with the present invention a test set designated generally as 60. In the test set 60 there is provided a source of a reference signal 61, a plurality of modulators 62, 63 and 64, a plurality of step attenuators 65, 66, 67 and 68, a plurality of unidirectional couplers 69, 70, 71, 72 and 73, a switch 74, a pulse generator 75 and four signal processors 76, 77, 78 and 79, each comprising a mixer circuit 80, a 500 Hz bandpass crystal filter 81 and a detector circuit 82.

The circuit of FIG. 13 is used for measuring the amplitude and phase of the forward and reverse S-parameters of the DUT 26 as defined by the following equations.

Forward Measurements $$S_{21} = \frac{TB}{RA} \text{ transmitted} \quad (14)$$

$$S_{11} = \frac{TA}{RA} \text{ reflected} \quad (15)$$

Reverse Measurements $$S_{12} = \frac{TA}{RB} \text{ transmitted} \quad (16)$$

$$S_{22} = \frac{TB}{RB} \text{ reflected} \quad (17)$$

To obtain the forward measurements described above, a reference signal from the signal source 61 is provided to the input of the DUT via the switch 74, the step attenuator 65 and the through-arm of the couplers 69 and 70. The coupler 69 couples a portion of the reference signal to the reference port RA for processing in the signal processor 79. The remainder of the reference signal is applied to the input of the DUT. A portion of the reference signal which is reflected from the input port of the DUT, called the test signal TA, is coupled via the coupler 70 through the step attenuator 67 to the modulator 63 wherein it is amplitude-modulated, as will be described below, and passed to the test signal port TA for signal processing in the signal processor 78. Another portion of the reference signal which is transmitted through the DUT, called the test signal TB, is coupled via the coupler 73 through the step attenuator 68 through the modulator 64 wherein it is amplitude modulated, as will be described below, and then to the test signal port TB for subsequent processing in the signal processor 76.

The reverse measurements are obtained by switching the switch 74 from the position shown in FIG. 13 to the coupling arm of the coupler 71 wherein it is coupled via the step attenuator 66 to its through-arm and then to the output of the DUT. A portion of the reference signal is coupled by means of the coupler 72 to the reference signal port RB for signal processing in the signal processor 77. That portion of the reference signal which is reflected from the output port of the DUT, i.e. the test signal TB, is coupled by means of the coupler 73 through the step attenuator 68 and the modulator 64 to the test signal port TB for processing in the signal processor 76. That portion of the reference signal which is transmitted through the DUT, i.e. the test signal TA, is coupled by means of the coupler 70 through the step attenuator 67 and the modulator 63 to the test port TA for further processing in the signal processor 78.

Figure 14:
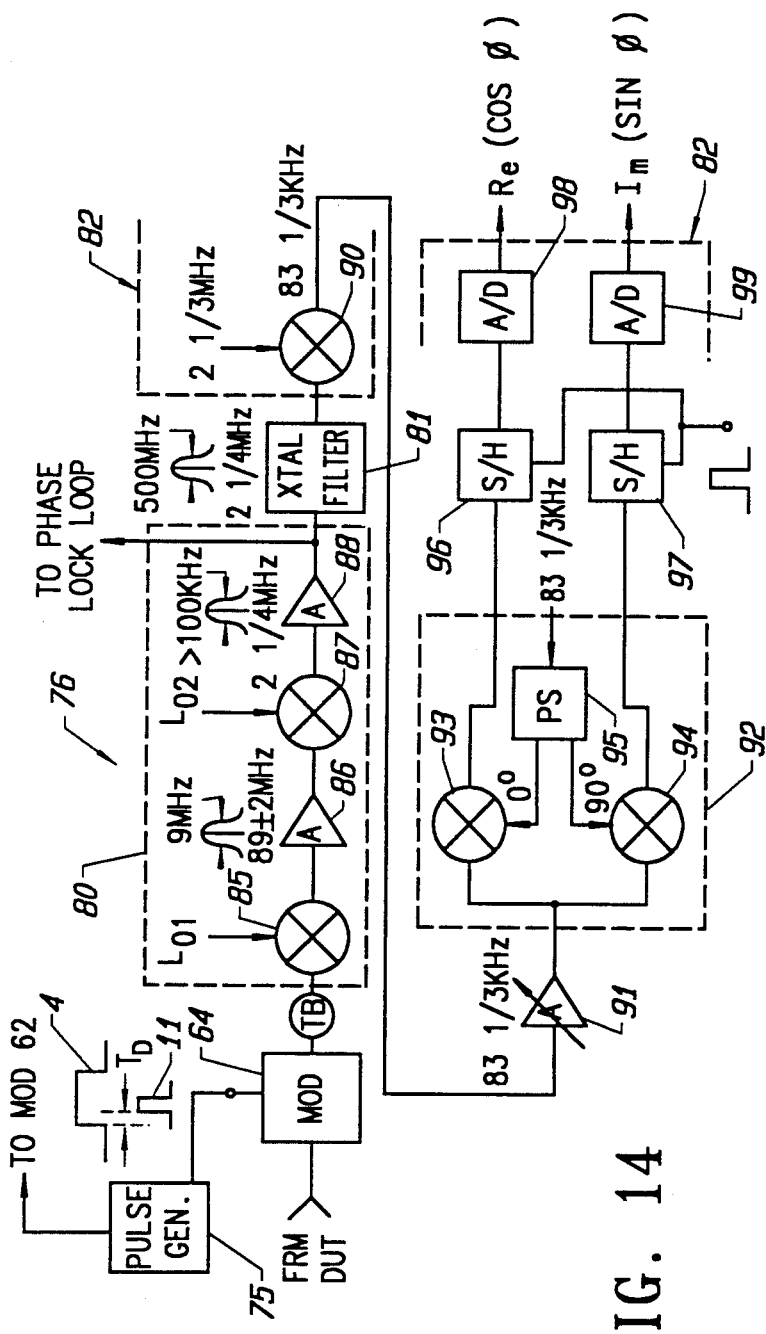
FIG. 14 is a block diagram showing in more detail the pulse measuring circuit of FIG. 13.
Figure 15:
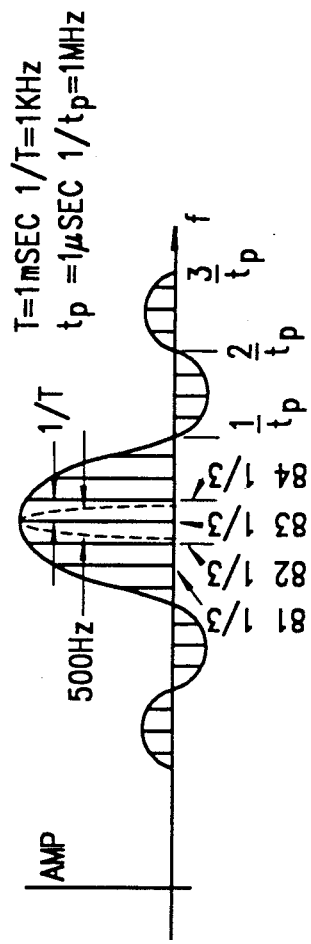
FIG. 15 is a partial diagram of the positive line spectrum of a phase-coherent pulse train used in the circuit of FIG. 14.

Referring to FIG. 14, there will now be described in detail one of the signal processors 76–78. In the processor 76 there is provided in the mixer circuit 80 a frequency converter 85, an amplifier 86, a mixer 87 and an amplifier 88. The converter 85 may be a conventional mixer, harmonic mixer or a sampler. The converter 85, in response to a local oscillator frequency L01, is provided for down-converting the frequency of the signal from the DUT applied to its input to 89±2 MHz. The amplifier 86, having a bandwidth of 9 MHz, is provided for amplifying the output of the frequency converter 85. In the mixer 87 means are provided for mixing, in response to a local oscillator frequency L02, the output of the amplifier 86 to down-convert the frequency thereof to $2\frac{1}{4}$ MHz. In the amplifier 88, having a bandwidth of greater than 100 KHz, means are provided for amplifying the output of the mixer 87. The output of the amplifier 88 is coupled to the input of the crystal filter 81 and to a phase-lock loop (not shown) in the source of reference signals 61 for controlling the frequency of the reference signals. In a well known manner, the local oscillator frequencies L01 and L02 are adjusted to provide the down-converted frequencies indicated as the frequency of the signal from the DUT is changed.

As described above, the crystal filter 81 comprises a bandwidth of 500 Hz having a center frequency of $2\frac{1}{4}$ MHz. The bandwidth of filter 81 is chosen to be less than $1/T$, where $1/T$ is the pulse repetition rate of the RF pulses applied to the DUT.

In the detector circuit 82 there is provided a mixer 90. The mixer 90 is provided for down-converting in response to a local oscillator frequency of $2\frac{1}{8}$ MHz the frequency of the signal from the crystal oscillator 81 to a frequency of $83\frac{1}{3}$ KHz. The output of the mixer 90 is coupled to the input of a variable amplifier 91 for amplifying the output of the mixer 90. The output of the amplifier 91 is coupled to a synchronous detector 92 comprising a mixer 93, a mixer 94 and a power splitter 95 coupled to a source of reference signals having a frequency of $83\frac{1}{3}$ KHz. The output of the circuit 95, like the corresponding circuits in the apparatus of FIGS. 7 and 8, provides reference signals to the mixers 93 and 94 which are 90° out of phase. The output of the mixers 93 and 94 are coupled respectively to a pair of sample-and-hold circuits 96 and 97. The outputs of the sample-and-hold circuits are coupled to a pair of analog-to-digital converters 98 and 99, respectively.

In operation, a CW reference RF signal from the source 61 is amplitude-modulated in the modulator 62 and routed through the step attenuator 65 and the through-arm of the couplers 69 and 70 to the input of the DUT. The test signal obtained at the output of the DUT is routed via the through-arm and coupling arm of the coupler 73 through the step attenuator 68 and applied to the input of the modulator 64. The pulse generator 75 produces the modulating pulse for modulating the modulator 62 and the time varied profiling pulse for modulating the modulator 64. The output of the modulator 64 is then down-converted in the mixer circuit 80 to a signal having a center frequency of $2\frac{1}{4}$ MHz. The output of the mixer 80 is then bandwidth limited to 500 Hz. In the detector circuit 82 the output of the crystal filter 81, after being down-converted to $83\frac{1}{3}$ KHz, is detected by the synchronous detector 92 so as to provide on the output of the analog-to-digital converters 98 and 99, a pair of dc signals, the amplitude of which corresponds to the real $R_e$ and imaginary $I_m$ components of the output of the DUT during the period of the profiling pulse 11, 12 used for modulating the modulator 64.

The pulse repetition frequency of the signal applied to the input of the DUT is chosen to be no less than 1 KHz. With a pulse repetition frequency of 1 KHz, the 500 Hz bandwidth of the crystal filter 81 insures that only the central spectral line of the output of the DUT will be detected as the profiling pulse, i.e. the modulating pulse applied to the input of the modulator 64, is shifted in time by a variable amount $T_D$ relative to the modulating pulse applied to the input of the modulator 62 as shown in the upper left corner of FIG. 14. Thus, for each position of the profiling pulse, as the profiling pulse applied to the input of the modulator 64 is shifted in time, the average amplitude and phase information contained within the central spectral line at the output of the DUT will be provided on the output of the analog-to-digital converters 98 and 99, thus providing an accurate measure of the amplitude and phase of the output pulses of the DUT over their entire period.

It will be noted that the signal processors 77 and 79, unlike the processors 76 and 78, do not require the profile pulse to modulate their input. This is because they are used simply to develop the reference signals RB and RA used in calculating the S-parameters described above whereas the processors 76 and 78 are used for calculating the test signals TB and TA.

Figure 16:
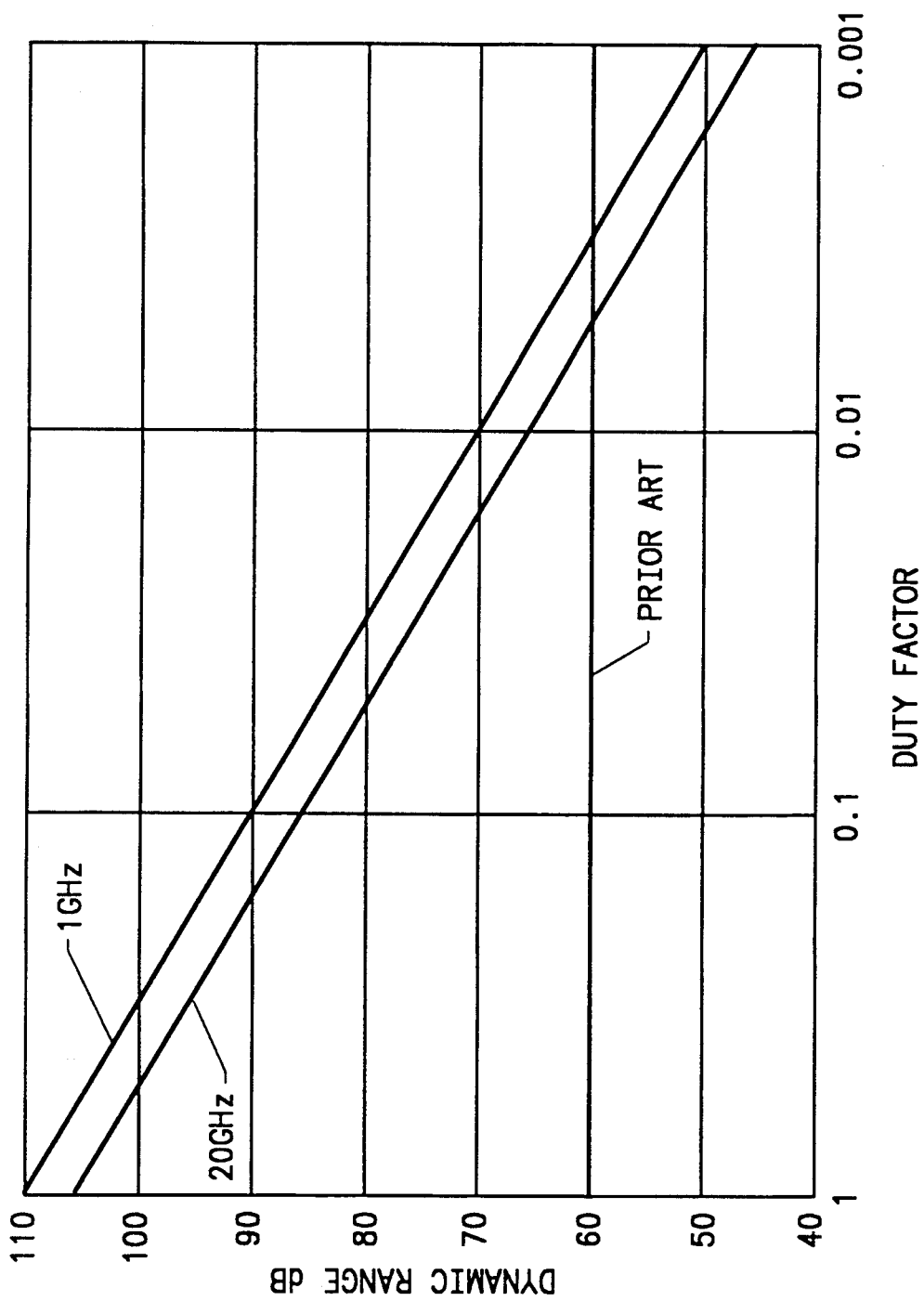
FIG. 16 is a diagram of the dynamic range versus duty factor of a prior art pulse measuring circuit and a pulse measuring circuit according to the present invention.

Referring to FIG. 16, there is shown a diagram of the dynamic range in decibels (dB) as a function of duty factor for the prior art circuit of FIG. 8 and the apparatus according to the present invention for two different reference pulse frequencies, e.g. 1 GHz and 20 GHz. As shown in FIG. 16, the dynamic range of the circuit of FIG. 8 is 60 dB and does not vary as a function of duty factor while the dynamic range of the apparatus of the present invention increases as a function of a decreasing duty factor at the rate of:

$$20 \log_{10} DF \qquad (18)$$

where $$DF = \tau/T$$

Thus, for a duty factor corresponding to a reference pulse train having a cycle time of 1,000 nsec. and a profiling pulse having a period of 10 nsec. corresponding to a duty factor of 0.01, the dynamic range of the present invention is 5-10 dB higher than the dynamic range of the prior art apparatus. Moreover, as the cycle time of the reference pulse decreases to CW, the dynamic range of the apparatus of the present invention is from 45-50 dB higher than the prior known apparatus. This is an important advantage where low amplitude input signals are being measured.

While a preferred embodiment of the present invention is described above, it is contemplated that various modifications may be made thereto without departing from the spirit and scope of the present invention. Accordingly, it is intended that the embodiment described be considered only as an illustration of the present invention and that the scope thereof should not be limited thereto but be determined by reference to the claims hereinafter provided and their equivalents.

What is claimed is:

1. For use in a vector network analyzer having means for providing a train of RF pulses having a predetermined pulse repetition rate to a device-under-test (DUT) for measuring the amplitude and phase of the central spectral line in RF pulses received from said DUT in response thereto, an RF pulse profiling apparatus comprising:
- means for time modulating the amplitude of said RF pulses received from said DUT;
- means responsive to said modulating means for down-converting the frequency of said RF pulses received from said DUT;
- means responsive to said down-converting means for filtering said RF pulses received from said DUT, said filtering means having a bandwidth which is less than said predetermined pulse repetition rate; and
- means responsive to said filtering means for providing a pair of dc output signals having an amplitude corresponding to the real and imaginary components of said RF pulses received from said DUT.

2. For use in a vector network analyzer having means for providing a train of RF pulses having a predetermined pulse repetition rate to a device-under-test (DUT) for measuring the amplitude and phase of the central spectral line in RF pulses received from said DUT in response thereto, an RF pulse profiling apparatus comprising:
- means responsive to profiling pulses for modulating the amplitude of said RF pulses received from said DUT;
- means for shifting said profiling pulses in time relative to said RF pulses provided to said DUT for measuring the amplitude of individual spectral lines in said RF pulses received from said DUT;
- means responsive to said modulating means for down-converting the frequency of said RF pulses received from said DUT;
- means responsive to said down-converting means for filtering said RF pulses received from said DUT, said filtering means having a bandwidth which is less than said predetermined pulse repetition rate; and
- means responsive to said filtering means for providing a pair of dc output signals having an amplitude corresponding to the real and imaginary components of said RF pulses received from said DUT.

3. An apparatus according to claim 2 wherein said profiling pulses have a pulse repetition rate equal to the pulse repetition rate of said RF pulses provided to said DUT.

4. For use in a vector network analyzer having means for providing a train of RF pulses having a predetermined pulse repetition rate of at least 1 KHz to a device-under-test (DUT) for measuring the amplitude and phase of the central spectral line in RF pulses received from said DUT in response thereto, an RF pulse profiling apparatus comprising:
- means for time modulating the amplitude of said RF pulses received from said DUT;
- means responsive to said modulating means for down-converting the frequency of said RF pulses received from said DUT to a frequency of about $2\frac{1}{4}$ MHz;
- means responsive to said down-converting means for filtering said RF pulses received from said DUT, said filtering means having a bandwidth of about 500 Hz; and
- means responsive to said filtering means for providing a pair of dc output signals having an amplitude corresponding to the real and imaginary components of said RF pulses received from said DUT.

5. For use in a vector network analyzer having means for providing a train of RF pulses having a predetermined pulse repetition rate to a device-under-test (DUT) for measuring the amplitude and phase of the central spectral line in RF pulses received from said DUT in response thereto, an RF pulse profiling apparatus comprising:
- means for time modulating the amplitude of said RF pulses received from said DUT;
- means responsive to said modulating means for down-converting the frequency of said RF pulses received from said DUT;
- means responsive to said down-converting means for filtering said RF pulses received from said DUT, said filtering means having a bandwidth which is less than said predetermined pulse repetition rate;
- means responsive to said filtering means for down-converting the frequency of the output of said filtering means; and
- a synchronous detecting means responsive to said down-converting means for down-converting the frequency of the output of said filtering means for providing a pair of dc output signals having an amplitude corresponding to the real and imaginary components of said RF pulses received from said DUT.

6. For use in a vector network analyzer for measuring the amplitude and phase of the central spectral line in an RF pulse having a selected frequency which are reflected from or transmitted through a device-under-test (DUT), an RF pulse profiling apparatus comprising:
- means for providing a profiling pulse;
- means responsive to said profiling pulse for modulating the amplitude of said RF pulse having said selected frequency;
- first means coupled to said modulating means for down-converting the frequency of said RF pulse having said selected frequency for providing an RF pulse having a lower frequency;
- means coupled to said down-converting means for filtering said RF pulse having said lower frequency, said filtering means having a predetermined bandwidth centered at said lower frequency;
- second means coupled to said filtering means for down-converting the frequency of said RF pulse having said lower frequency for providing an RF pulse having a still lower frequency; and
- synchronous detecting means coupled to said second converting means for providing a first output signal comprising the amplitude and phase of the real component of said RF pulse having said still lower frequency and a second output signal comprising the amplitude and phase of the imaginary component of said RF pulse having said still lower frequency.

7. An apparatus according to claim 6 wherein said profiling pulse has the same cycle time as said RF pulse having said selected frequency and said profiling pulse providing means comprises means for shifting said profiling pulse in time relative to said RF pulse having said selected frequency.

8. An apparatus according to claim 6 wherein said predetermined bandwidth of said filtering means comprises 500 Hz.

9. An RF pulse profiling apparatus comprising:
- means for providing a profiling pulse;
- means responsive to said profiling pulse for modulating the amplitude of an RF pulse having a first frequency;

first means coupled to said modulating means for down-converting the frequency of said RF pulse having said first frequency for providing an RF pulse having a second frequency;

first means coupled to said first down-converting means for amplifying said RF pulse having said second frequency, said first amplifying means having a predetermined bandwidth;

second means coupled to said first amplifying means for down-converting the frequency of said RF pulse having said second frequency for providing an RF pulse having a third frequency;

second means coupled to said second down-converting means for amplifying said RF pulse having said third frequency, said second amplifying means having a predetermined bandwidth;

means coupled to said second amplifying means for filtering said RF pulse having said third frequency, said filtering means having a predetermined bandwidth centered at said third frequency;

third means coupled to said filtering means for down-converting the frequency of said RF pulse having said third frequency for providing an RF pulse having a fourth frequency;

third means coupled to said third down-converting means for amplifying said RF pulse having said fourth frequency;

synchronous detecting means coupled to said third amplifying means for providing a first output signal corresponding to the amplitude and phase of the real component of said RF pulse having said fourth frequency and a second output signal corresponding to the amplitude and phase of the imaginary component of said RF pulse having said fourth frequency;

means coupled to said detecting means which is responsive to a sampling pulse for providing a sample of said first and said second output signal from said detecting means, respectively; and means coupled to said sample providing means for converting said first and said second sample to a first and a second digital signal, respectively.

10. An apparatus according to claim 9 wherein said profiling pulse has the same cycle time as said RF pulse having said first frequency and said profiling pulse providing means comprises means for shifting said profiling pulse in time relative to said RF pulse having said first frequency.

11. An apparatus according to claim 9 wherein said bandwidth of said filtering means comprises 500 Hz.

12. For use in a vector network analyzer having means for providing a train of RF pulses having a predetermined pulse repetition rate to a device-under-test (DUT) for measuring the amplitude and phase of individual spectral lines in RF pulses received from said DUT in response thereto, a method of profiling RF pulses comprising the steps of:
 time modulating the amplitude of said RF pulses received from said DUT;
 down-converting the frequency of said RF pulses received from said DUT;
 filtering said RF pulses received from said DUT after their frequency has been down-converted so as to provide RF pulses having a predetermined bandwidth which is less than said predetermined pulse repetition rate; and
 providing in response to said RF pulses having said predetermined bandwidth a pair of dc output signals having an amplitude corresponding to the real and imaginary components of said RF pulses received from said DUT.

13. For use in a vector network analyzer having means for providing a train of RF pulses having a predetermined pulse repetition rate to a device-under-test (DUT) for measuring the amplitude and phase of individual spectral lines in RF pulses received from said DUT in response thereto, a method of profiling RF pulses comprising the steps of:
 modulating in response to profiling pulses the amplitude of said RF pulses received from said DUT;
 shifting said profiling pulses in time relative to said RF pulses provided to said DUT for measuring the amplitude of individual spectral lines in said RF pulses received from said DUT;
 down-converting the frequency of said RF pulses received from said DUT;
 filtering said RF pulses received from said DUT after their frequency has been down-converted so as to provide RF pulses having a predetermined bandwidth which is less than said predetermined pulse repetition rate; and
 providing in response to said RF pulses having said predetermined bandwidth a pair of dc output signals having an amplitude corresponding to the real and imaginary components of said RF pulses received from said DUT.

14. A method according to claim 13 wherein said profiling pulses have a pulse repetition rate equal to the pulse repetition rate of said RF pulses provided to said DUT.

15. For use in a vector network analyzer having means for providing a train of RF pulses having a predetermined pulse repetition rate of at least 1 KHz to a device-under-test (DUT) for measuring the amplitude and phase of individual spectral lines in RF pulses received from said DUT in response thereto, a method of profiling RF pulses comprising the steps of:
 time modulating the amplitude of said RF pulses received from said DUT;
 down-converting the frequency of said RF pulses received from said DUT to a frequency of about $2\frac{1}{4}$ MHz;
 filtering said RF pulses received from said DUT after their frequency has been down-converted so as to provide RF pulses having a predetermined bandwidth of about 500 Hz; and
 providing in response to said RF pulses having said predetermined bandwidth a pair of dc output signals having an amplitude corresponding to the real and imaginary components of said RF pulses received from said DUT.

16. A method of measuring the amplitude and phase of the central spectral line in an RF pulse having a selected frequency which are reflected from or transmitted through a device-under-test (DUT) in a vector network analyzer, comprising the steps of:
 providing a profiling pulse;
 modulating in response to said profiling pulse the amplitude of said RF pulse having said selected frequency;
 down-converting the frequency of said RF pulse having said selected frequency for providing an RF pulse having a lower frequency;

filtering said RF pulse having said lower frequency for providing an RF pulse having a predetermined bandwidth centered at said lower frequency;

down-converting the frequency of said RF pulse having said lower frequency for providing an RF pulse having a still lower frequency; and providing a first output signal comprising the real component of said RF pulse having said still lower frequency and a second output signal comprising the imaginary component of said RF pulse having said still lower frequency.

17. A method according to claim 16 wherein said profiling pulse has the same cycle time as said RF pulse having said selected frequency and said step of providing said profiling pulse comprises the step of shifting said profiling pulse in time relative to said RF pulse having said selected frequency.

18. A method according to claim 16 wherein said predetermined bandwidth of said filtering means comprises 500 Hz.

19. A method of profiling an RF pulse to obtain the amplitude and phase thereof comprising the step of:

providing a profiling pulse;

modulating in response to said profiling pulse the amplitude of an RF pulse having a first frequency;

down-converting the frequency of said RF pulse having said first frequency for providing an RF pulse having a second frequency;

amplifying said RF pulse having said second frequency;

down-converting the frequency of said RF pulse having said second frequency for providing an RF pulse having a third frequency;

amplifying said RF pulse having said third frequency;

filtering said RF pulse having said third frequency for providing an RF pulse having a predetermined bandwidth centered at said third frequency;

down-converting the frequency of said RF pulse having said third frequency and said predetermined bandwidth for providing an RF pulse having a fourth frequency;

amplifying said RF pulse having said fourth frequency;

providing in a synchronous detecting means a first output signal corresponding to the amplitude and phase of the real component of said RF pulse having said fourth frequency and a second output signal corresponding to the amplitude and phase of the imaginary component of said RF pulse having said fourth frequency;

providing a sample of said first and said second output signal from said detecting means, respectively;

converting said first and said second sample to a first and a second digital signal, respectively; and calculating from said first and said second digital signal the amplitude and phase of said RF pulse having said fourth frequency.

20. A method according to claim 19 wherein said profiling pulse has the same cycle time as said RF pulse having said first frequency and said step of providing said profiling pulse comprises the step of shifting said profiling pulse in time relative to said RF pulse having said first frequency.

21. A method according to claim 19 wherein said bandwidth of said filtering means comprises 500 Hz.

* * * * *

UNITED STATES PATENT AND TRADEMARK OFFICE
CERTIFICATE OF CORRECTION

PATENT NO. : 5,059,915

DATED : October 22, 1991

INVENTOR(S) : MARTIN I. GRACE et al

It is certified that error appears in the above-identified patent and that said Letters Patent is hereby corrected as shown below:

Column 1, line 15, after "used" insert --for measuring--.

Signed and Sealed this

Second Day of March, 1993

Attest:

STEPHEN G. KUNIN

Attesting Officer

Acting Commissioner of Patents and Trademarks